United States Patent
Zhou et al.

(10) Patent No.: US 12,424,935 B2
(45) Date of Patent: *Sep. 23, 2025

(54) DEVICES AND METHODS FOR OPERATING A CHARGE PUMP

(71) Applicant: SKYWORKS SOLUTIONS, INC., Irvine, CA (US)

(72) Inventors: Bo Zhou, Acton, MA (US); Guillaume Alexandre Blin, Carlisle, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/608,502

(22) Filed: Mar. 18, 2024

(65) Prior Publication Data
US 2024/0275280 A1 Aug. 15, 2024

Related U.S. Application Data

(63) Continuation of application No. 18/085,473, filed on Dec. 20, 2022, now Pat. No. 11,942,861, which is a
(Continued)

(51) Int. Cl.
*G05F 3/02* (2006.01)
*H02M 3/07* (2006.01)
(Continued)

(52) U.S. Cl.
CPC .............. *H02M 3/07* (2013.01); *H03F 3/191* (2013.01); *H03F 3/245* (2013.01); *H03F 3/72* (2013.01);
(Continued)

(58) Field of Classification Search
CPC ....... H02M 3/07; H02M 1/0003; H03F 3/191; H03F 3/72; H03F 3/245; H03F 2200/111; H03F 2203/7209
See application file for complete search history.

(56) References Cited

U.S. PATENT DOCUMENTS

| 5,159,543 A | 10/1992 | Yamawaki |
| 5,982,220 A | 11/1999 | Kim |

(Continued)

FOREIGN PATENT DOCUMENTS

| CN | 203775168 | 8/2014 |
| JP | 2007330049 A | 12/2007 |

OTHER PUBLICATIONS

International Search Report and Written Opinion for PCT/US2015/058264 issued on Apr. 8, 2016.

*Primary Examiner* — Quan Tra
(74) *Attorney, Agent, or Firm* — Chang & Hale LLP

(57) ABSTRACT

Devices and methods for operating a charge pump. In some implementations, a charge pump module includes a clock circuit configured generate to a first clock signal and a second clock signal, the first clock signal having a lower frequency than the second clock signal. The charge pump module also includes a driving circuit configured to generate a first set of clock signals based on the first clock signal and a second set of clock signals based on the second clock signal, the driving circuit coupled to the clock circuit. The charge pump module further includes a charge pump core including a set of capacitances, the charge pump core configured to charge the set of capacitances based on the first set of clock signals and the second set of clock signals.

20 Claims, 10 Drawing Sheets

Related U.S. Application Data continuation of application No. 16/594,890, filed on Oct. 7, 2019, now Pat. No. 11,539,288, which is a continuation of application No. 14/928,052, filed on Oct. 30, 2015, now Pat. No. 10,447,151.

(60) Provisional application No. 62/073,505, filed on Oct. 31, 2014.

(51) Int. Cl.
| | |
|---|---|
| H03F 3/191 | (2006.01) |
| H03F 3/24 | (2006.01) |
| H03F 3/72 | (2006.01) |
| H02M 1/00 | (2006.01) |

(52) U.S. Cl.
CPC ...... *H02M 1/0003* (2021.05); *H03F 2200/111* (2013.01); *H03F 2203/7209* (2013.01)

(56) References Cited

U.S. PATENT DOCUMENTS

| | | | |
|---|---|---|---|
| 6,249,445 | B1 | 6/2001 | Sugasawa |
| 6,600,296 | B2 | 7/2003 | Hazucha |
| 7,948,301 | B2 | 5/2011 | Cook et al. |
| 8,633,759 | B2 | 1/2014 | Sung |
| 9,537,398 | B2 * | 1/2017 | Arakawa ............... G11C 16/30 |
| 2001/0001231 | A1 | 5/2001 | Rapp |
| 2002/0110009 | A1 | 8/2002 | Umeda |
| 2002/0171467 | A1 * | 11/2002 | Worley, Sr. ............ H05B 45/30 327/514 |
| 2005/0030771 | A1 | 2/2005 | Conte et al. |
| 2008/0265861 | A1 | 10/2008 | Wang |
| 2009/0179686 | A1 | 7/2009 | Rosen et al. |
| 2009/0322414 | A1 | 12/2009 | Oraw et al. |
| 2011/0241767 | A1 | 10/2011 | Curatola et al. |
| 2012/0235736 | A1 | 9/2012 | Levesque et al. |
| 2013/0234785 | A1 | 9/2013 | Dai et al. |

* cited by examiner

DEVICES AND METHODS FOR OPERATING A CHARGE PUMP

CROSS-REFERENCE TO RELATED APPLICATION(S)

This application is a continuation of U.S. patent application Ser. No. 18/085,473, filed Dec. 20, 2022, entitled "DEVICES AND METHODS FOR OPERATING A CHARGE PUMP," which is a continuation of U.S. patent application Ser. No. 16/594,890, filed Oct. 7, 2019, entitled "DEVICES AND METHODS FOR OPERATING A CHARGE PUMP," now U.S. Pat. No. 11,539,288, issued Dec. 27, 2022, which is a continuation of U.S. patent application Ser. No. 14/928,052, filed Oct. 30, 2015, entitled "CIRCUITS, DEVICES, AND METHODS FOR OPERATING A CHARGE PUMP," now U.S. Pat. No. 10,447,151, issued Oct. 15, 2019, which claims priority to U.S. Provisional Application No. 62/073,505, filed Oct. 31, 2014, entitled "CIRCUITS, DEVICES, AND METHODS FOR OPERATING A CHARGE PUMP." The contents of each of the above-referenced application(s) are hereby expressly incorporated by reference herein in their entireties for all purposes.

BACKGROUND

Field

The present disclosure relates to voltage supply systems in radio-frequency (RF) applications.

Description of the Related Art

Many circuits in portable devices such as wireless devices require or utilize DC/DC power conversion to efficiently utilize limited battery supply resources. Often, voltages that exceed a battery voltage are needed or desired, while in other situations, voltages that are significantly less than the battery voltage are utilized.

A charge pump may be a device, circuit, module, and/or component that may receive an input voltage and may create a higher or lower voltage based on the input voltage. For example, a charge pump may be DC to DC converter that may use capacitors as energy storage elements to convert the input voltage into a higher voltage or a lower voltage.

SUMMARY

In some implementations, the present disclosure relates to a charge pump module. The charge pump module includes a clock circuit configured generate to a first clock signal and a second clock signal, the first clock signal having a lower frequency than the second clock signal. The charge pump module also includes a driving circuit configured to generate a first set of clock signals based on the first clock signal and a second set of clock signals based on the second clock signal, the driving circuit coupled to the clock circuit. The charge pump module further includes a charge pump core including a set of capacitances, the charge pump core configured to charge the set of capacitances based the first set of clock signals and the second set of clock signals.

In some embodiments, the charge pump module further includes an oscillator configured to provide an initial clock signal to the clock circuit.

In some embodiments, the first clock signal and the second clock signal are based on the initial clock signal.

In some embodiments, the charge pump module further includes an inverter configured to generate an inverted initial clock signal based on the initial clock signal, the inverter coupled to the clock circuit and the driving circuit.

In some embodiments, the charge pump module further includes a control module configured to detect a control signal.

In some embodiments, the clock circuit is further configured to generate the second clock signal based on the control signal.

In some embodiments, the charge pump core includes a set of switches coupled to the set of capacitances.

In some embodiments, the charge pump core is further configured to open and close the set of switches at a first rate based on the first set of clock signals.

In some embodiments, the charge pump core is further configured to open and close the set of switches at a second rate based on the second set of clock signals.

In some embodiments, the clock circuit is coupled to a timing capacitance.

In some embodiments, the clock circuit is further configured to generate the second clock signal when the timing capacitance reaches a threshold voltage.

In some embodiments, the clock circuit is further configured to generate the first clock signal after generating the second clock signal for a period of time.

In some implementations, the present disclosure relates to a radio-frequency (RF) module. The RF module includes a packaging substrate configured to receive a plurality of components. The RF module also includes a power amplification system implemented on the packaging substrate, the power amplification system including a voltage supply system, the voltage supply system including a charge pump module, the charge pump module including a clock circuit configured generate to a first clock signal and a second clock signal, the first clock signal having a lower frequency than the second clock signal, a driving circuit configured to generate a first set of clock signals based on the first clock signal and a second set of clock signals based on the second clock signal, the driving circuit coupled to the clock circuit, and a charge pump core including a set of capacitances, the charge pump core configured to charge the set of capacitances based the first set of clock signals and the second set of clock signals.

In some embodiment, the present disclosure relates to a method of operating a charge pump. The method includes generating a first clock signal. The method also includes charging a set of capacitances of a charge pump module based the first clock signal. The method further includes generating a second clock signal based on a control signal, the second clock signal having a higher frequency than the first clock signal. The method further includes charging the set of capacitances of a charge pump module based the second clock signal.

In some embodiments, charging the set of capacitances based on the first clock signal includes generating a first set of clock signals based on the first clock signal.

In some embodiments, charging the set of capacitances based on the first clock signal further includes opening and closing a set of switches of the charge pump module at a first rate based on the first set of clock signals.

In some embodiments, charging the set of capacitances based on the second clock signal includes generating a second set of clock signals based on the second clock signal.

In some embodiments, charging the set of capacitances based on the second clock signal further includes opening and closing a set of switches of the charge pump module at a second rate based on the second set of clock signals.

In some embodiments, the method further comprises generating the first clock signal after a period of time has elapsed since generating the second clock signal.

In some embodiments, generating the first clock signal includes slowing down an initial clock signal received from an oscillator.

In some implementations, the present disclosure relates to a radio-frequency (RF) device that includes a transceiver generate to a radio-frequency (RF) signal. The RF device includes a front-end module (FEM) in communication with the transceiver, the FEM including a power amplification system configured to amplify the RF signal, the power amplification system including a voltage supply system, the voltage supply system including a charge pump module, the charge pump module including a clock circuit configured generate to a first clock signal and a second clock signal, the first clock signal having a lower frequency than the second clock signal, a driving circuit configured to generate a first set of clock signals based on the first clock signal and a second set of clock signals based on the second clock signal, the driving circuit coupled to the clock circuit, and a charge pump core including a set of capacitances, the charge pump core configured to charge the set of capacitances based on the first set of clock signals and the second set of clock signals.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
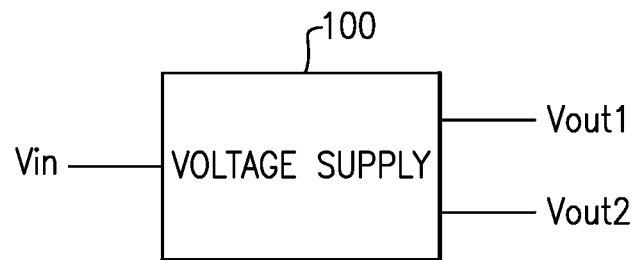
FIG. 1 is a block diagram of a voltage supply system according to some embodiments of the present disclosure.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION OF SOME EMBODIMENTS

The headings provided herein, if any, are for convenience only and do not necessarily affect the scope or meaning of the claimed invention.

A charge pump may be a device, circuit, module, and/or component that may receive an input voltage create a higher or lower voltage based on the input voltage. For example, a charge pump may be DC to DC converter that may use capacitors as energy storage elements to create the higher voltage or lower voltage. Charge pumps may be used in various electronic devices and/or components. For example, antenna switch modules (ASMs) may use charge pumps. In another example, power management circuits may also use charge pumps. In a further example, RF circuits may use a charge pump. The charge pump may cause and/or introduce noise into a device, system, and/or circuit when the charge pump is in operation. For example, the charge pump may cause noise in an RF control circuit that uses and/or includes the charge pump. A charge pump may also be referred to as a charge pump module.

Disclosed are non-limiting examples of systems, devices, circuits and/or methods related to techniques for operating a charge pump. An oscillator may be used to drive the charge pump (e.g., may open/close switches in the charge pump which may cause one or more capacitors of the charge pump to charge/discharge). In one embodiment, the clock signal generated by the oscillator may be used to operate the charge pump when output voltage of the charge pump is used. In another embodiment, the clock signal generated by the oscillator may be slowed to generate a slower clock signal (e.g., the frequency of the clock signal may be reduced/decreased to generate the slower clock signal). The slower clock signal may be used to operate the charge pump when the charge pump is not in use (e.g., when the output voltage of the charge pump is not used). This may reduce the amount of noise caused and/or introduced by the charge pump when the output voltage generated by the charge pump is not used. Slowing down the clock frequency may reduce the noise in a device, system, and/or circuit that uses the charge pump without degrading the performance and/or operation of the charge pump. For example, the noise in the device, system, and/or circuit may decrease because the charge pump is operating less frequently. Although the present disclosure may be described in the context of charge pumps, it will be understood that one or more features of the present disclosure may also be utilized in other applications.

FIG. 1 shows a block diagram of a voltage supply system 100 having one or more features as described herein. Such a system can generate a plurality of output voltages (e.g., $V_{out1}$ and $V_{out2}$) based on an input voltage ($V_{in}$). In one embodiment, the voltage supply system 100 may include a charge pump. The charge pump may be configure to generate the output voltages $V_{out1}$ and $V_{out2}$ based on the input voltage $V_{in}$, as discussed in more detail below. For example, the charge pump may include one or more switches (e.g., field-effect transistors (FETs) such as metal-oxide semiconductor field-effect transistors (MOSFETs)) coupled to one or more capacitors (e.g., capacitances), as discussed in more detail below.

In some implementations, a device and/or a circuit (e.g., a voltage supply system and/or a charging pump) having one or more features described herein may be included in an RF device such as a wireless device. Such a device and/or a circuit may be implemented directly in the wireless device, in a modular form as described herein, or in some combination thereof. In some embodiments, such a wireless device may include, for example, a cellular phone, a smart-phone, a hand-held wireless device with or without phone functionality, a wireless tablet, etc.

Figure 2:
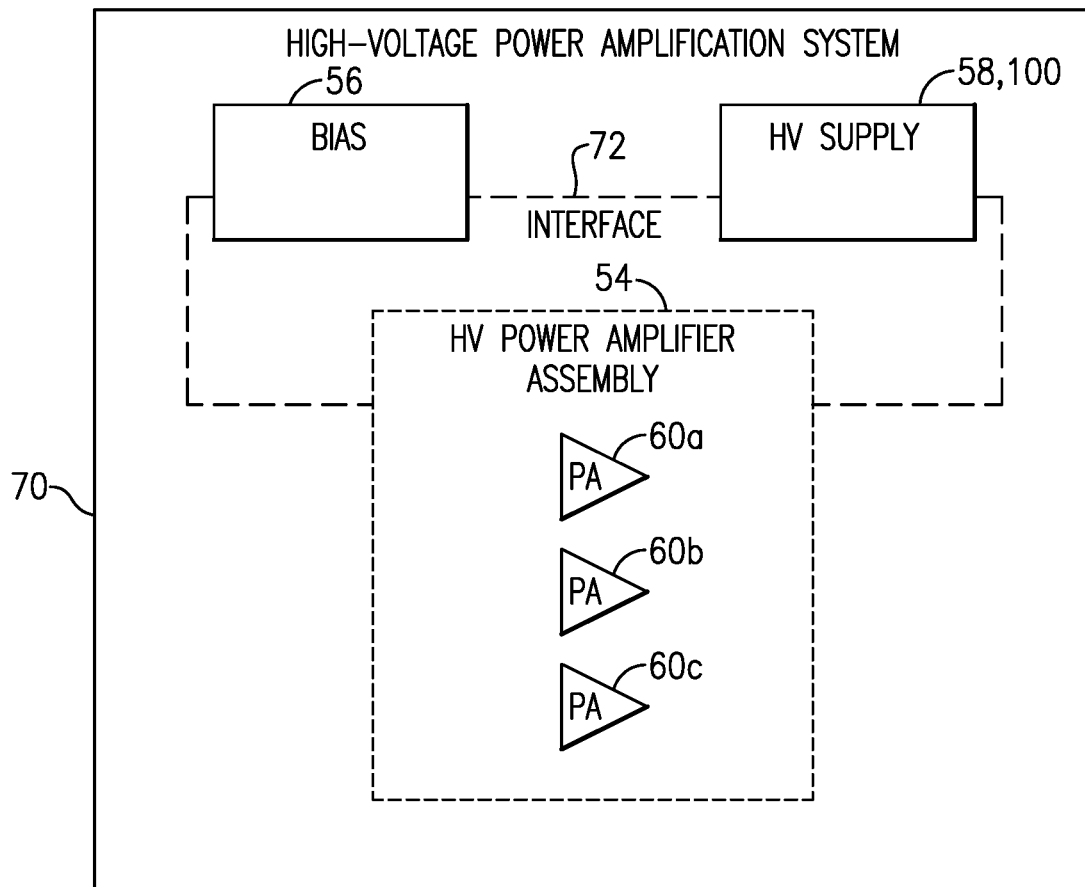
FIG. 2 shows an example application of the voltage supply system in FIG. 1 some embodiments of the present disclosure.

FIG. 2 shows an example application in which the voltage supply system 100 of FIG. 1 can be implemented. In the example of FIG. 2, such a voltage system can include a high-voltage (HV) supply system 58 (also referred to herein as 100) configured to provide a plurality of supply voltage signals for an HV power amplification system 70. Examples related to such an HV supply system are described in 62/116,458 filed Feb. 15, 2015, entitled DEVICES AND METHODS RELATED TO MULTI-MODE POWER MANAGEMENT, the disclosure of which is hereby expressly incorporated by reference herein in its entirety. Although the voltage supply system (100 in FIG. 1) is described herein in such a context, it will be understood that one or more features of such a voltage supply system can also be utilized in other applications.

In the example of FIG. 2, the HV power amplification system 70 can include a power amplifier assembly 54 having one or more power amplifiers (PAS) (e.g., 60a-60c). Some or all of such PAs can be configured to operate in an HV mode.

Referring to FIG. 2, the HV power amplification system 70 can further include a bias system 56. Such a system can be configured to provide bias signals to the power amplifier assembly 54 for operation of the PA(s).

Also referring to FIG. 2, the HV power amplification system 70 can further include an interface 72 between the power amplifier assembly 54 and either or both of the bias system 56 and the HV supply system 100. In some embodiments, such an interface can also provide interfacing functionality between the HV power amplification system 70 and an external system (not shown).

Many circuits in portable devices such as wireless devices require or utilize DC/DC power conversion to efficiently utilize limited battery supply resources. Often, voltages that exceed a battery voltage are needed or desired, while in other situations, voltages that are significantly less than the battery voltage are utilized.

Figure 3A:
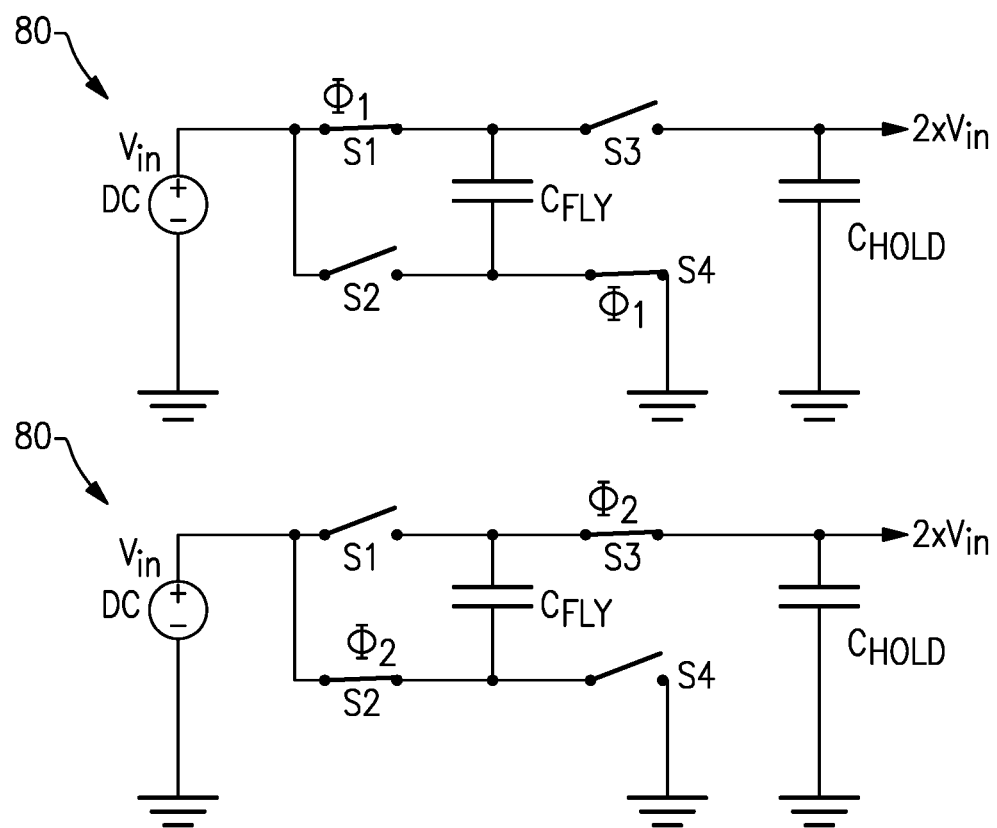
FIG. 3A shows schematic diagrams of a charge pump doubler circuit according to some embodiments of the present disclosure.
Figure 3B:
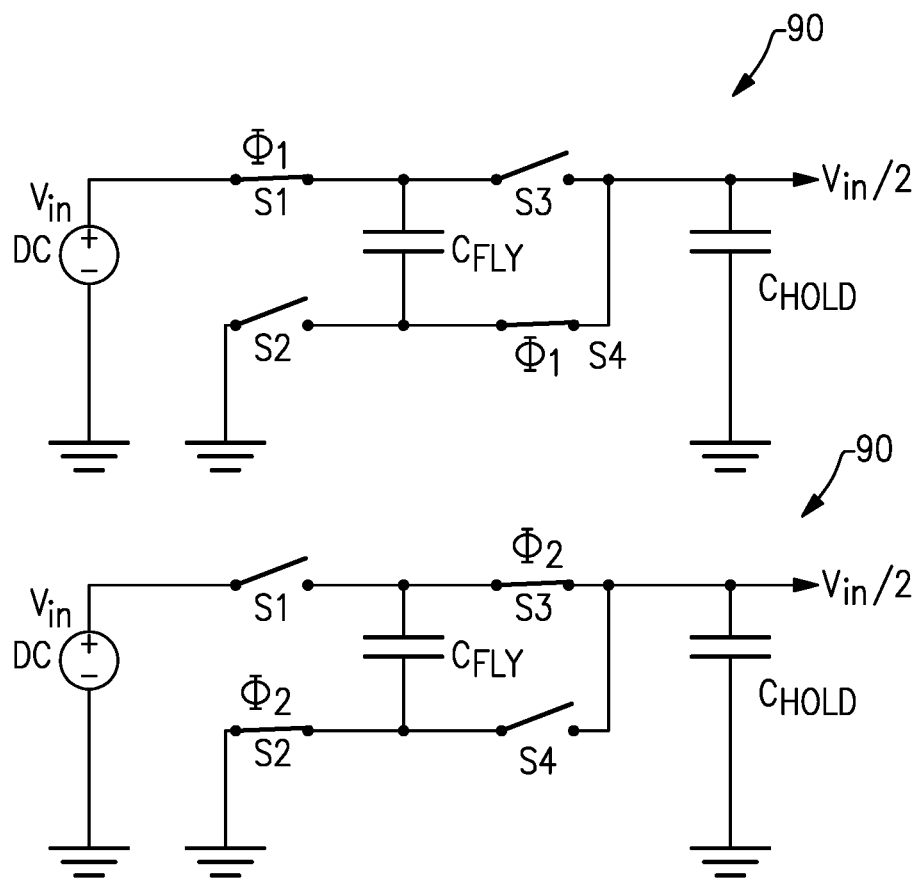
FIG. 3B shows schematic diagrams of a charge pump divider circuit according to some embodiments of the present disclosure.

FIGS. 3A and 3B show examples of two such separate circuits configured to provide dual output voltages. Such dual output voltages are depicted as being twice an input voltage, or $2 \times V_{in}$, for a charge pump doubler circuit (FIG. 3A) and half of the input voltage, or $V_{in}/2$, for a charge pump divider circuit (FIG. 3B). The input voltage $V_{in}$ can be, for example, a battery voltage ($V_{batt}$). Although described in such doubling and halving examples, it will be understood that other voltages relative to the input can be obtained.

In the example of FIG. 3A, the charge pump doubler circuit can be operated in two phases to generate an output ($2 \times V_{in}$) that is approximately twice the input voltage $V_{in}$. In the first phase denoted by $\Phi_1$ at closed switches S1 and S4, a flying capacitor ($C_{Fly}$) is charged to approximately $V_{in}$ by a switching configuration listed in the $\Phi_1$ portion of Table 1A. During that time, a holding capacitor ($C_{Hold}$), which was charged during the last cycle, discharges to provide the output. In the second phase denoted by $\Phi_2$ at closed switches S2 and S3, the holding capacitor ($C_{Hold}$) is charged while the output of approximately $2 \times V_{in}$ is provided, by a switching configuration listed in the $\Phi_2$ portion of Table 1A, in which the charged flying capacitor ($C_{Fly}$) is placed in series with the input voltage $V_{in}$.

TABLE 1A

| Phase | S1 | S2 | S3 | S4 |
|---|---|---|---|---|
| $\Phi_1$ | Closed | Open | Open | Closed |
| $\Phi_2$ | Open | Closed | Closed | Open |

In the example of FIG. 3B, the charge pump divider circuit can be operated in two phases to generate an output ($V_{in}/2$) that is approximately half the input voltage $V_{in}$. In the first phase denoted by $\Phi_1$ at closed switches S1 and S4, a flying capacitor ($C_{Fly}$) and a holding capacitor ($C_{Hold}$) are shown to be placed in series between the input voltage $V_{in}$ and ground. When S1 and S4 are closed, $C_{Fly}$ is substantially uncharged, and $C_{Hold}$ is previously charged to yield across it a voltage of $V_{in}/2$. Assuming that capacitance values of $C_{Fly}$ and $C_{Hold}$ are similar, $C_{Hold}$ will charge to yield across it a voltage of $V_{in}/2$. Accordingly, the output node is shown to have a voltage of $V_{in}/2$. Table 1B lists a switching configuration for the foregoing first phase $\Phi_1$. In the second phase denoted by $\Phi_2$ at closed switches S2 and S3, $C_{Fly}$ (now charged to $V_{in}/2$) and $C_{Hold}$ are now electrically parallel between the output node and the ground, and the input voltage $V_{in}$ is disconnected. Accordingly, the output voltage can be maintained at approximately $V_{in}/2$ as either or both of $C_{Fly}$ and $C_{Hold}$ discharge through the output node. Table 1B lists a switching configuration for the foregoing second phase $\Phi_2$.

TABLE 1B

| Phase | S1 | S2 | S3 | S4 |
|---|---|---|---|---|
| $\Phi_1$ | Closed | Open | Open | Closed |
| $\Phi_2$ | Open | Closed | Closed | Open |

Again, although various examples are described in the context of doubling and halving, it will be understood that voltage-increasing and voltage-decreasing factors can be other than 2.

Figure 4:
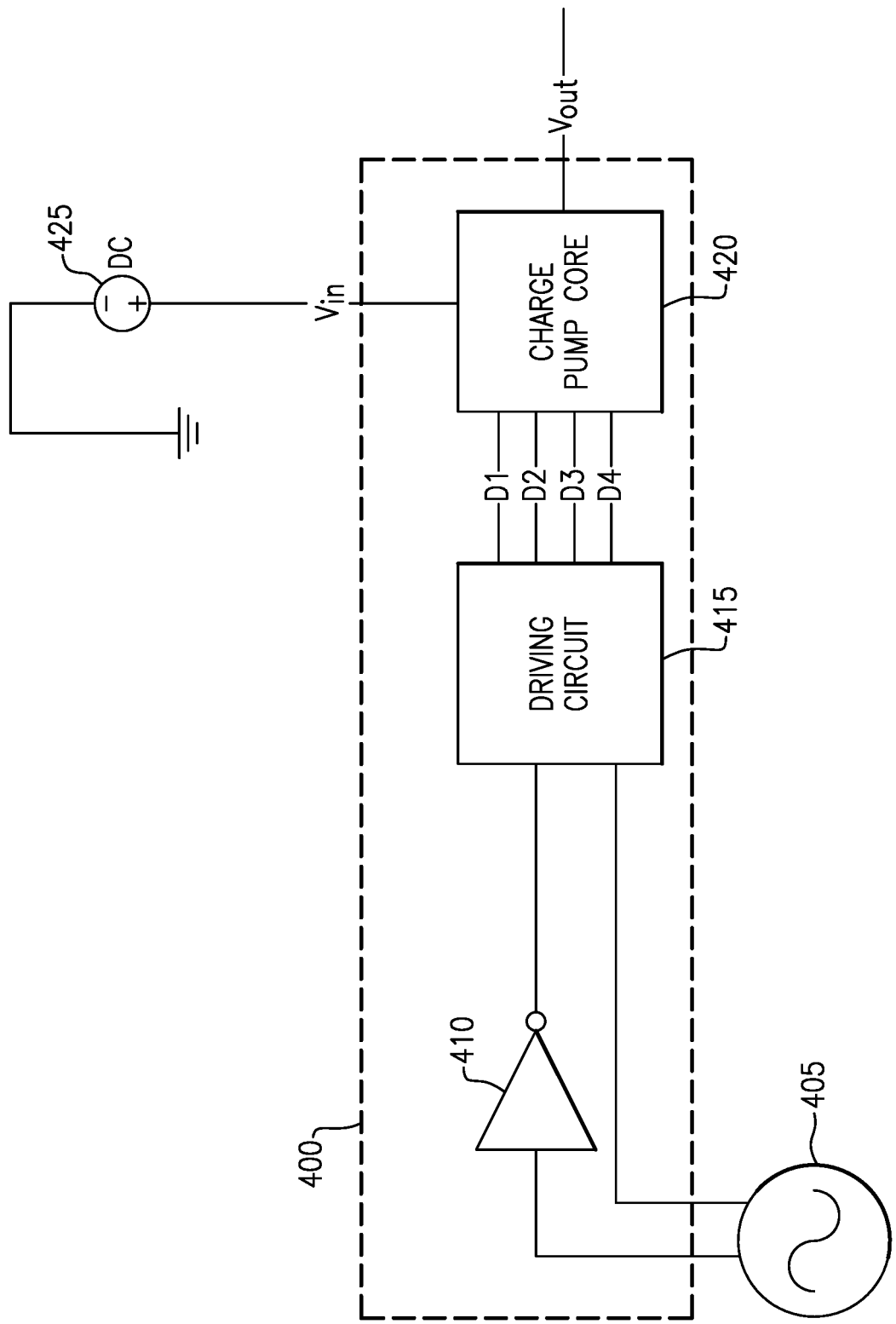
FIG. 4 is a block diagram illustrating an example charge pump module, according to some embodiments of the present disclosure.

FIG. 4 is a block diagram illustrating an example charge pump module (e.g., charge pump) 400, according to some embodiments of the present disclosure. The charge pump module 400 includes an oscillator 405, an inverter 410, a driving circuit 415, and charge pump core 420. The charge pump module 400 is coupled to a voltage source 425. The voltage source 425 may generate an input voltage ($V_{in}$) and may provide the input voltage $V_{in}$ to the charge pump core 420. Although the voltage source 425 is illustrated as separate from the charge pump module 400, the voltage source 425 may be included as part of the charge pump module 400 in other embodiments.

In one embodiment, the oscillator 405 may be configured to generate a signal, such as a clock signal. The clock signal may have a frequency F1 (e.g., 500 megahertz, 10 kilohertz, etc.). In one embodiment, the oscillator 405 may be a fixed frequency oscillator. For example, the oscillator 405 may be unable to generate signals with multiple frequencies. The oscillator 405 is coupled to the inverter 410 and the driving circuit 415. The inverter 410 may generate an inverted clock signal based on the clock signal generated by the oscillator 405. For example, the inverter 410 may invert the clock signal received from the oscillator 405 to generate the inverted clock signal. Although the oscillator 405 is illustrated as separate from the charge pump module 400 in FIG. 4, in other embodiments, the oscillator 405 may be part of the charge pump module 400 (e.g., may be included in the charge pump module 400).

In one embodiment, the driving circuit 415 may generate signals D1, D2, D3, and D4 based on the clock signal received from the oscillator 405 and the inverted clock signal received from the inverter 410. The signals D1, D2, D3, and D4, may have the same frequency as the clock signal and/or the inverted clock signal but may have different phases (different phase offsets). For example, signal D1 and D2 may have the same frequency as the clock signal but may have different phases (e.g., signal D1 may be phase shifted from signal D2). In another example, signals D3 and D4 may have the same frequency as the inverted clock signal but may have different phases. The driving circuit 415 is coupled to the charge pump core 420 and the signals D1, D2, D3, and D4 may be provided to the charge pump core 420.

The charge pump core 420 may include a set of capacitors (e.g., capacitances) coupled to the voltage source 425 via a set of switches. For example, referring to FIGS. 3A and 3B, the charge pump core 420 may include one or more flying capacitors coupled to the voltage source 425 via one or switches (e.g., MOSFET switches). The charge pump core may also include one or more holding capacitors coupled to the voltage source 425 via one or more switches.

In one embodiment, the charge pump core 420 may be configured to charge and discharge the set of capacitors based on the signals D1, D2, D3, and D4 received from the driving circuit 415. For example, the charge pump core 420 may close one or more of the switches based on one or more of the signals D1, D2, D3, and D4. Closing one or more of the switches based on one or more of the signals D1, D2, D3, and D4 may allow the capacitors to charge using the voltage $V_{in}$ (received from the voltage source 425). In another example, the charge pump core 420 may open one or more of the switches based on one or more of the signals D1, D2, D3, and D4. Opening one or more of the switches based on one or more of the signals D1, D2, D3, and D4 may allow the capacitors to discharge. Charging and discharging the set of capacitors may allow the charge pump core 420 to generate the output voltage $V_{out}$, where $V_{out}$ may be higher or lower than $V_{in}$. For example, $V_{out}$ may be double the voltage of $V_{in}$ (e.g., the charge pump core 420 may double $V_{in}$). In another example, $V_{out}$ may be half the voltage of $V_{in}$ (e.g., the charge pump core 420 may halve $V_{in}$). In other examples, the charge pump may triple voltages, invert voltages, and/or fractionally multiply/scale voltages (such as ×3/2, ×4/3, ×2/3, etc.).

As discussed above, the charge pump module 400 may be used as a power source for other circuits, components and/or modules. In one embodiment, the charge pump module 400 may be used to help maintain a voltage (used by a device, system, and/or circuit) at a desired level. For example, when the voltage drops, the charge pump module 400 may transfer a charge from the one or more storage capacitors to maintain the voltage at the desired level. In another embodiment, the charge pump module 400 may be used to convert a first voltage to a different voltage. For example, the charge pump module 400 may convert the voltage $V_{in}$ into a different output voltage $V_{out}$, as discussed above.

In one embodiment, the charge pump module 400 may continue to operate even thought a voltage does not need to be maintained or does not need to be converted. For example, when the charge pump module 400 is used to by a separate circuit/component (e.g., a power amplifier) to double the voltage $V_{in}$, capacitors of the charge pump module 400 (e.g., one or more flying capacitors) may be constantly charged and discharged by opening and closing the switches of the charge pump module 400 based on the signals D1, D2, D3, D4, and/or the clock signal. However, when the separate circuit/component does not need to double the voltage $V_{in}$, the charge pump module 400 may continue to open and close the switches of the charge pump module 400 (based on the signals D1, D2, D3, D4, and/or the clock signal) because the oscillator 405 may continue to generate the clock signal. Opening and closing the switches of the charge pump module 400 may produce and/or cause noise (e.g., switching noise) in the circuits, components, and/or modules coupled to the charge pump module 400. Thus, the charge pump module 400 may continuously produce and/or cause noise even when other circuits, components, and/or modules are not using the voltage $V_{out}$ generated by the charge pump module 400.

Figure 5:
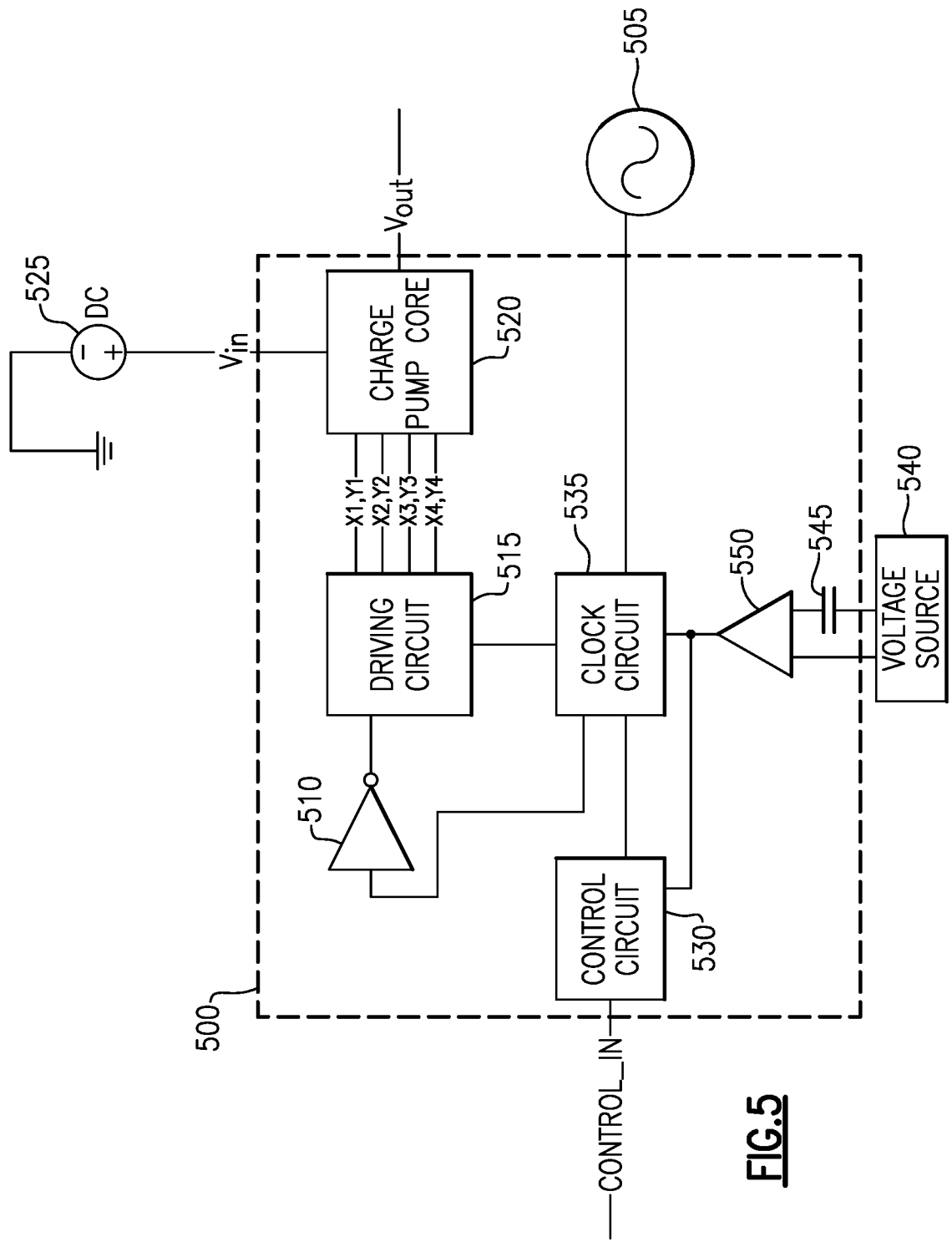
FIG. 5 is a block diagram illustrating an example charge pump module, according to some embodiments of the present disclosure.

FIG. 5 is a block diagram illustrating an example charge pump module (e.g., charge pump) 500, according to some embodiments of the present disclosure. The charge pump module 500 includes an oscillator 505, an inverter 510, a driving circuit 515, charge pump core 520, a control circuit 530, a clock circuit 535, a timing capacitor 545, and a comparator 550. The charge pump module 500 is coupled to a voltage source 525. The voltage source 525 may generate an input voltage ($V_{in}$) and may provide the input voltage to the charge pump core 520. Although the voltage source 525 is illustrated as separate from the charge pump module 500, the voltage source 525 may be included as part of the charge pump module 500 in other embodiments.

In one embodiment, the oscillator 505 may be configured to generate a signal, such as an initial clock signal. The initial clock signal may have a frequency F1 (e.g., 500 megahertz, 10 kilohertz, etc.). In one embodiment, the oscillator 505 may be a fixed frequency oscillator. For example, the oscillator 505 may be unable to generate signals with multiple frequencies. The oscillator 505 is coupled to the clock circuit 535. Although the oscillator 505 is illustrated as separate from the charge pump module 500 in FIG. 5, in other embodiments, the oscillator 505 may be part of the charge pump module 500 (e.g., may be included in the charge pump module 500).

In one embodiment, the clock circuit 535 may generate multiple different signals based on the initial clock signal and each signal may have a different frequency. For example, the clock circuit may generate a first signal with a frequency F2 and a second signal with a frequency F3. In one embodiment, the frequency F2 have the same frequency as the initial clock signal (e.g., frequency F1 may be the same as frequency F2). In another embodiment, the frequency F2 may have a different frequency as the initial clock signal. In one embodiment, the frequency F3 may be less than the frequency F2. For example, the frequency F3 may be 1/32 of the frequency F2. In another example, the frequency F3 may be 1/64 of the frequency F2. The first signal (with the frequency F2) may be referred to as a fast clock signal or a standard/normal clock signal. The second signal (with the frequency F3) may be referred to as a slow clock signal. The clock circuit 535 is coupled to the driving circuit 515 and the inverter 510. The clock circuit may provide the first signal and/or the second signal to the driving circuit 515 and the inverter 510.

In one embodiment, the clock circuit 535 may generate the first signal (with the frequency F2) based on a control signal received from the control circuit 530. For example, the clock circuit 535 may initially generate the second signal (with the frequency F3). The control circuit 530 may generate a control signal indicating that the clock circuit 535 should generate the first signal (with the frequency F2). For example, the clock circuit 535 may activate the voltage source 540 based on the control signal and the voltage source 540 may provide a voltage to the timing capacitor 545 and the comparator 550. The control signal may also be referred to as a CHARGE_HUNGER signal. As the timing capacitor 545 charges, the comparator 550 may compare the output of the timing capacitor 545 with the voltage provided by the voltage source 540. When the output of the timing capacitor 545 is equal (or greater than) the voltage provided by the voltage source 540, the comparator 550 may provide a signal having a logic high state (e.g., a "1") to the clock circuit 535. The clock circuit 535 may generate the first signal (with the frequency F2) when the clock circuit 535 receives the signal (having the logic high state) from the comparator 550. The clock circuit 535 may stop generating the first signal (with the frequency F2) after a period of time (e.g., a few milliseconds, a second, etc.) and may resume generating the second signal (with the frequency F3). For example, the clock circuit 535 may automatically stop generating the first signal and resume generating the second signal after the period of time has elapsed (e.g., after the clock circuit 535 has generated the first signal for the period of time). Although the voltage source 540 is illustrated as separate from the voltage source 525, in other embodiments, the voltage source 525 may provide the voltage $V_{in}$ to both the charge pump core 520, the timing capacitor 545, and the comparator 550.

In one embodiment, the clock circuit 535 may initially generate the second signal (with the frequency F3). The control circuit 530 may generate a control signal indicating that the clock circuit 535 should generate the first signal (with the frequency F2). The clock circuit 535 may also activate the voltage source 540 based on the control signal and the voltage source 540 may provide a voltage to the timing capacitor 545 and the comparator 550. The clock circuit 535 may generate the first signal (with the frequency F1) while the timing capacitor 545 charges. As the timing capacitor 545 charges, the comparator 550 may compare the output of the timing capacitor 545 with the voltage provided by the voltage source 540. When the output of the timing capacitor 545 is equal (or greater than) the voltage provided by the voltage source 540, the comparator 550 may provide a signal having a logic high state (e.g., a "1") to the clock circuit 535. The clock circuit 535 may resume generating the second signal (with the frequency F3) based on the signal having the logic high state (e.g., the clock circuit 535 may generate the first signal with the frequency F2 until the timing capacitor 545 reaches a threshold voltage).

In one embodiment, the output of the comparator 550 may be coupled to the control circuit 530 (in addition to or instead of being coupled to the clock circuit 535). The control circuit 530 may use the output of the comparator 550 to generate a control signal indicating whether the clock circuit 535 should generate the first signal (with the frequency F2) or the second signal (with the frequency F3), as discussed above. For example, the control circuit 530 may generate a control signal having a logic low state (e.g., a "0") and the clock circuit 535 may generate the second signal based on the logic low state. As the timing capacitor 545 charges (after activating the voltage source 540, as discussed above), the control circuit 530 may generate a control signal having a logic high state (e.g., a "1"). The clock circuit 535 may generate the first signal based on the logic high state until the timing capacitor 545 reaches a threshold voltage, as discussed above. When the timing capacitor reaches the threshold voltage, the comparator 550 may transmit a signal to the control circuit 530 and the control circuit may generate a control signal having a logic low state based on the signal from the comparator 550. The clock circuit 535 may resume generating the second signal based on the logic low state.

In one embodiment, the clock circuit 535 may discharge the timing capacitor 545 after the output of the timing capacitor 545 is equal (or greater than) the voltage provided by the voltage source 540. This may allow the timing capacitor 545 to recharge when another control signal (indicating that the clock circuit should generate the first signal) is received from the control circuit 530. The clock circuit 535 may also discharge the timing capacitor 545 when a control signal is received from the control circuit 530.

In another embodiment, the clock circuit 535 may generate the first signal (with the frequency F2) and the second signal (with the frequency F3) based on control signals received from the control circuit 530. For example, the control circuit 530 may generate a first control signal indicating that the clock circuit 535 should generate the first signal (with the frequency F2) and the clock circuit 535 may generate the first signal based on the first control signal. In another example, the control circuit 530 may generate a second control signal indicating that the clock circuit 535 should generate the second signal (with the frequency F3) and the clock circuit 535 may generate the second signal based on the second control signal.

In one embodiment, the control circuit 530 may generate one or more control signals based on an input signal CONTROL_IN received from another component, circuit and/or module. For example, a power amplifier may provide the input signal CONTROL_IN to the control circuit 530 and the control circuit 530 may generate one or more controls signals instructing the clock circuit to generate the first signal and/or the second signal, as discussed above. In one embodiment, the input signal CONTROL_IN may include multiple signals received from multiple lines, pins, traces, etc.

In one embodiment, the control circuit 530 may generate a control signal indicating that the clock circuit 535 should generate the first signal (with the frequency F2) each time the signal CONTROL_IN changes. For example, each time the signal CONTROL_IN changes state from a logic high state (e.g., "1") to a logic low state (e.g., "0") and vice versa, the control circuit 530 may generate the control signal indicating that the clock circuit 535 should generate the first signal.

The clock circuit 535 is coupled to the inverter 510 and the driving circuit 515. The inverter 510 may generate an inverted first signal based on the first signal generated by the clock circuit 535. The inverter 510 may also generate an inverted second signal based on the second signal generated by the clock circuit 535.

In one embodiment, the driving circuit 515 may generate signals X1, X2, X3, and X4 based on the first signal received from the clock circuit 535 and the inverted first signal received from the inverter 510. The signals X1, X2, X3, and X4, may have the same frequency as the first signal or the inverted first signal but may have different phases (different phase offsets). For example, signal X1 and X2 may have the same frequency as the first signal but may have different phases (e.g., signal X1 may be phase shifted from signal X2). In another example, signals X3 and X4 may have the same frequency as the inverted clock signal but may have different phases. In a further example, signal Y1 and Y2 may have the same frequency as the second signal but may have different phases. In another example, signals Y3 and Y4 may have the same frequency as the inverted second signal but may have different phases. The driving circuit 515 is coupled to the charge pump core 520 and the signals X1, X2, X3, X4 (e.g., a first set of signals) and the signals Y1, Y2, Y3, and Y4 (e.g., a second set of signals) may be provided to the charge pump core 520. The signals Y1, Y2, Y3, and Y4 may have a lower frequency than the signals X1, X2, X3, and X4.

As discussed above, the charge pump core 520 may include a set of capacitors coupled to the voltage source 525 via a set of switches. The charge pump core may also include one or more holding capacitors coupled to the voltage source 525 via one or more switches. In one embodiment, the charge pump core 520 may be configured to charge and discharge the set of capacitors based on the signals X1, X2, X3, X4 and the signals Y1, Y2, Y3, and Y4 received from the driving circuit 515. Closing one or more of the switches based on one or more of the signals X1, X2, X3, X4 and the signals Y1, Y2, Y3, and Y4 may allow the capacitors to charge using the voltage $V_{in}$ (received from the voltage source 525). Opening one or more of the switches based on one or more of the signals X1, X2, X3, X4 and the signals Y1, Y2, Y3, and Y4 may allow the capacitors to discharge. Charging and discharging the set of capacitors may allow the charge pump core 520 to generate the output voltage $V_{out}$, where $V_{out}$ may be higher or lower than $V_{in}$, as discussed above.

Although the comparator 550 and the timing capacitor 545 are illustrated as part of the charge pump module 500 in FIG. 5, the comparator and/or the timing capacitor 545 may be separate from the charge pump module 500 in other embodiments.

As discussed above, a charge pump module may generally continue to open and close the switches of the charge pump module because the oscillator coupled to the charge pump module may continue to generate the clock signal. Opening and closing the switches of the charge pump module may produce and/or cause noise (e.g., switching noise) in the circuits, components, and/or modules coupled to the charge pump module. The control circuit 530 and the clock circuit 535 may allow the charge pump module to decrease and/or lower the frequency of the initial clock signal generated by the oscillator 505 when the output $V_{out}$ of the charge pump module 500 is not used. For example, the clock circuit 535 may generate the second signal (with the frequency F3) when the output $V_{out}$ of the charge pump module 500 is not used and/or based on the control signals generated by the control circuit 530 as discussed above. The driving circuit 515 may generate the signals Y1, Y2 Y3, and Y4 based on the second signal, as discussed above. Because the second signal has a frequency F3 which is lower than the frequency F2 of the first signal, the signals Y1, Y2, Y3, and Y4 will have lower frequencies than the signals X1, X2, X3, and X4. Thus, the charge pump core 520 may open and close the switches of the charge pump core 520 less frequently when the driving circuit 515 provides the signals Y1, Y2, Y3, and Y4 (when compared to signals X1, X2, X3, and X4). For example, the charge pump core 520 may open/close the switches of the charge pump core 520 at a first rate based on the signals Y1, Y2, Y3, and Y4 and may open/close the switches at a second rate based on the signals X1, X2, X3, and X4. The first rate may be lower than the second rate. Opening and closing the switches of the charge pump core less frequently may allow the charge pump module 500 to operate while producing and/or causing less noise.

In addition, the control circuit 530 and the clock circuit 535 also allow the charge pump module to increase the frequency of the initial clock signal generated by the oscillator 505 when the output $V_{out}$ of the charge pump module 500 is used. For example, the clock circuit 535 may generate the first signal (with the frequency F2) when the output $V_{out}$ of the charge pump module 500 is used and/or based on the control signals generated by the control circuit 530 as discussed above. The driving circuit 515 may generate the signals X1, X2, X3, and X4 based on the first signal, as discussed above. Because the first signal has a frequency F2 which is higher than the frequency F3 of the first signal, the signals X1, X2, X3, and X4 will have higher frequencies than the signals Y1, Y2, Y3, and Y4. Thus, the charge pump core 520 may open and close the switches of the charge pump core 520 more frequently when the driving circuit 515 provides the signals X1, X2, X3, and X4 (when compared to signals Y1, Y2, Y3, and Y4). Opening and closing the switches of the charge pump core more frequently may allow the charge pump module 500 to operate normally when the output $V_{out}$ of the charge pump module 500 is used.

Figure 6:
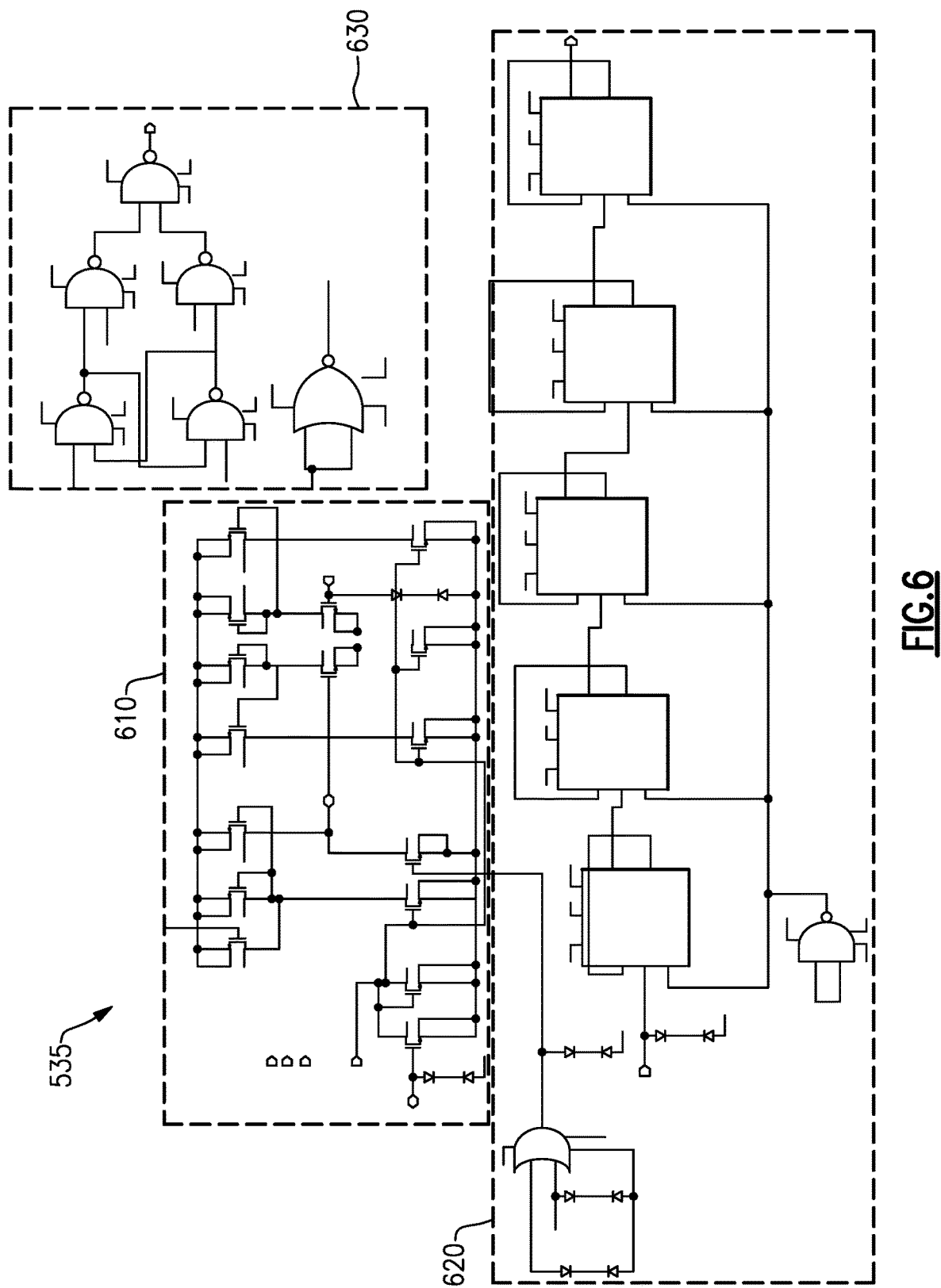
FIG. 6 is a block diagram illustrating an example clock circuit, according to some embodiments of the present disclosure.

FIG. 6 is a block diagram illustrating an example clock circuit 535, according to some embodiments of the present disclosure. The clock circuit 535 includes a timing control circuit 610, a clock slowing circuit 620, and a selection circuit 630. The timing control circuit 610, the clock slowing circuit 620 and the selection circuit 630 may be interconnected. For example, each of the timing control circuit 610, the clock slowing circuit 620 and the selection circuit 630 may be connected to each other.

In one embodiment, the clock slowing circuit 620 includes a plurality of flip-flops (e.g., D flip-flops, T flip-flops, JK flip-flops, etc.). The clock slowing circuit 620 may receive a clock signal from an oscillator. The clock slowing circuit 620 may provide (e.g., pass) the clock signal through the plurality of flip-flops (e.g., pass the clock signal through the plurality of flip-flops in series) to slow down the clock signal (e.g., to decrease the frequency of the clock signal) to generate a clock signal that has a lower frequency (e.g., a slow clock signal with 1 the 32 frequency of the clock signal received from the oscillator). For example, referring to FIG. 5, the clock slowing circuit 620 may generate the second signal having the frequency F3. In another embodiment, the clock slowing circuit 620 may output the clock signal received from the oscillator without slowing down the clock signal. For example, referring to FIG. 5, the clock slowing circuit 620 may generate the first signal having the frequency F2.

In one embodiment, the selection circuit 630 may include a plurality of logic gates (e.g., AND gates, OR gates, NOR gates, NAND gates, etc.). The selection circuit 630 may control the operation of the clock slowing circuit 620. For example, the clock slowing circuit 620 may initially operate to slow down the clock signal received from the oscillator. The selection circuit 630 may receive a control signal from a control circuit (as discussed above in conjunction with FIG. 5) and the selection circuit 630 may cause and/or instruct the clock slowing circuit 620 to output the clock signal without slowing the clock signal. The clock slowing circuit 620 may output the clock signal received from the oscillator without slowing down the clock signal based on a control signal received from a control circuit (as discussed above in conjunction with FIG. 5).

In one embodiment, the timing control circuit 610 includes a plurality of interconnected switches (e.g., MOSFETs). The timing control circuit 610 may control the operation of the clock slowing circuit 620. For example, as discussed above, the clock slowing circuit 620 may output the clock signal without slowing the clock signal. After a period of time (e.g., 10 milliseconds, 100 milliseconds, etc.), the timing control circuit 610 may cause and/or instruct the clock slowing circuit 620 to resume slowing down the clock signal. For example, the timing control circuit 610 may monitor and/or track the amount of time that the clock slowing circuit 620 is outputting the clock signal without slowing down the clock signal. The timing control circuit 610 may automatically cause and/or instruct the clock slowing circuit 620 to resume slowing the clock signal after the period of time has passed.

Figure 7:
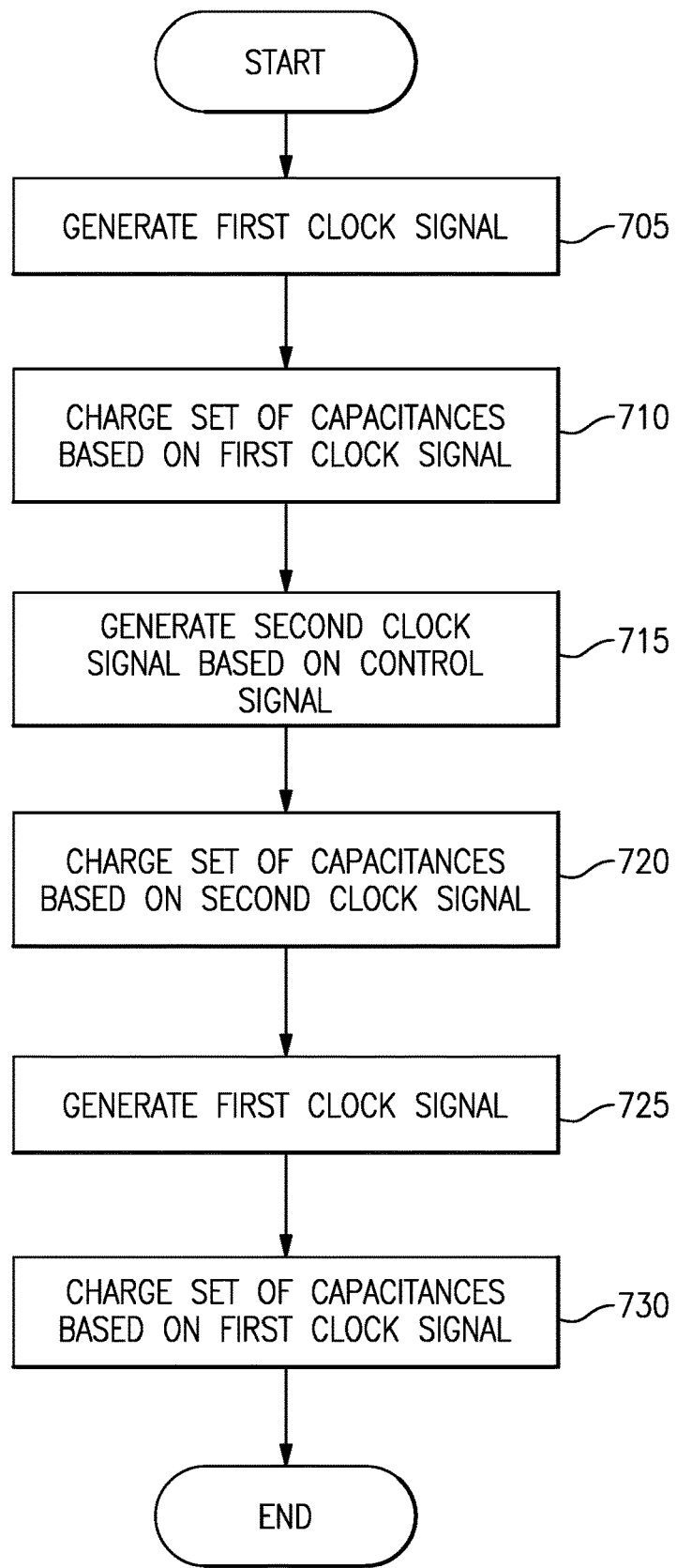
FIG. 7 is a flow diagram illustrating an example method of operating a charge pump module, in accordance with some embodiments of the present disclosure.

FIG. 7 is a flow diagram illustrating an example method 700 of operating a charge pump module, in accordance with some embodiments of the present disclosure. In some embodiments, the method 700 is at least partially performed by a charge pump module (such as the charge pump module 500 of FIG. 5). In other embodiments, the method 700 is at least partially performed by processing logic, including hardware, firmware, software, or a combination thereof. In further embodiments, the method 700 is at least partially performed by a processor executing code stored in a non-transitory computer-readable medium (e.g., a memory).

The method 700 begins at block 705 where the method 700 generates a first clock signal. For example, the method 700 may generate the first clock signal by slowing down an initial clock signal received from an oscillator, as discussed above. At block 710, the method 700 includes charging a set of capacitors (e.g., capacitors) based on the first clock signal. In one embodiment, charging the set of capacitors based on the first clock signal may include generating a first set of clock signals based on the first clock signal, as discussed above. In another embodiment, charging the set of capacitances based on the first clock signal may include opening and closing a set of switches of the charge pump module at a first rate based on the first set of clock signals, as discussed above.

The method 700 may generate the second clock signal at 715 based on a control signal, as discussed above. In one embodiment, the second clock signal may have a higher frequency than the first clock signal, as discussed above. At block 720, the method 700 includes charging the set of capacitances of a charge pump module based the second clock signal. In one embodiment, charging the set of capacitors based on the second clock signal may include generating a second set of clock signals based on the second clock signal, as discussed above. In another embodiment, charging the set of capacitances based on the second clock signal may include opening and closing the set of switches of the charge pump module at a second rate based on the second set of clock signals, as discussed above.

The method 700 includes generating the first clock signal at block 725. For example, the first clock signal may be generated after the second clock signal has been generated for a period of time (e.g., milliseconds, microseconds, etc.), as discussed above. In one embodiment, the first clock signal may be generated by slowing down the initial clock signal received from the oscillator, as discussed above. At block 730, the method 700 includes charging a set of capacitors (e.g., capacitors) based on the first clock signal.

Figure 8:
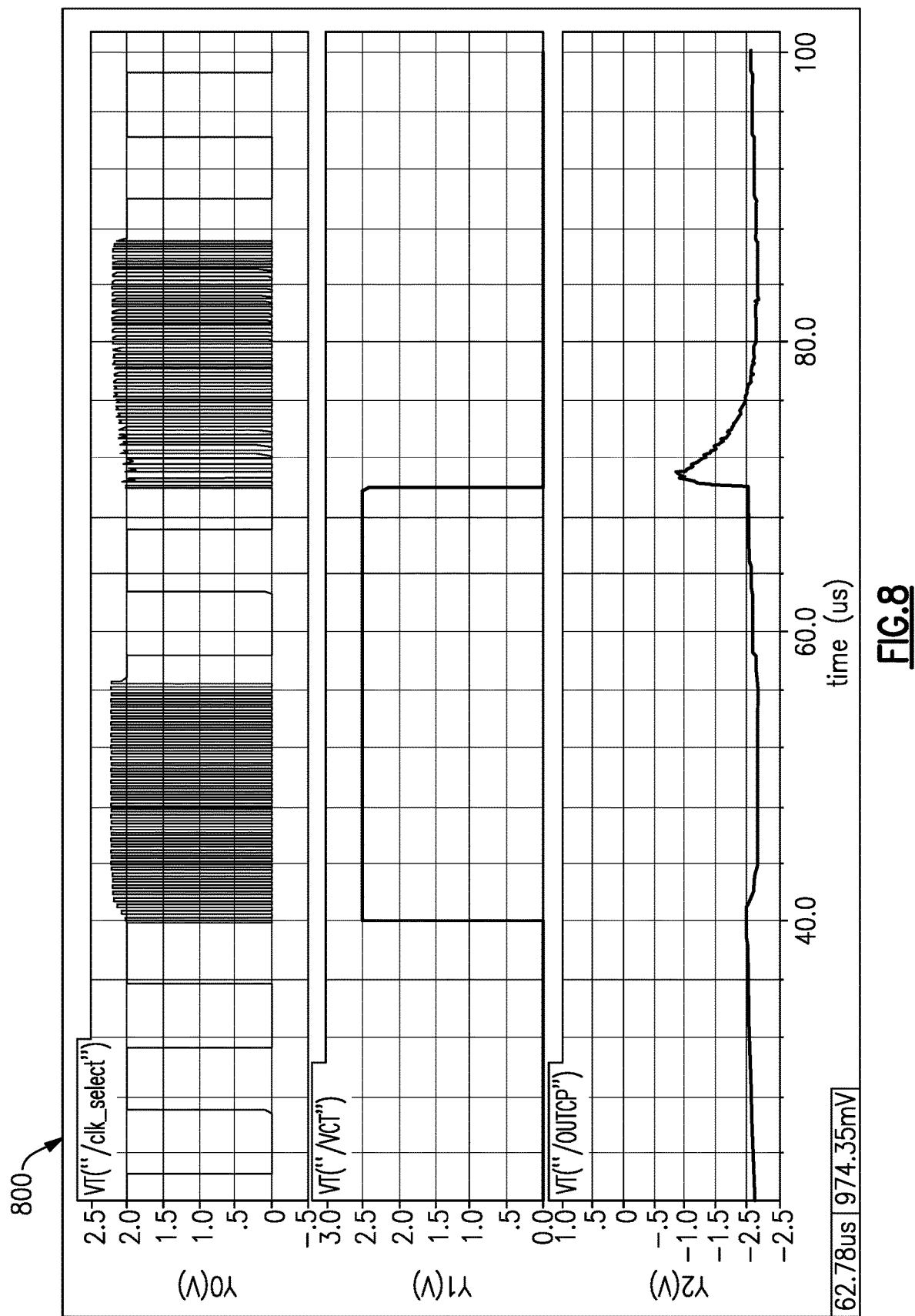
FIG. 8 is a graph 800 illustrating example voltages and/or signals of a device, system, and/or circuit that includes and/or uses a charge pump module having one or more features described herein.

FIG. 8 is a graph 800 illustrating example voltages and/or signals of a device, system, and/or circuit that includes and/or uses a charge pump module having one or more features described herein. The top portion of the graph 800 illustrates the clock signal (e.g., clk_select illustrated in FIG. 8) generated by clock circuit of the charge pump module (e.g., clock circuit 535 illustrated in FIG. 5) over time (in microseconds (µs)). As illustrated in FIG. 8, the clock signal has a first frequency between approximately 0 us and 40 µs. The clock signal has a second frequency between approximately 40 us and 58 µs. The second frequency is higher than the first frequency, as discussed above. The clock signal decrease to the first frequency between approximately 58 us and 70 us and increases to the second frequency between approximately 70 us and 86 µs.

The middle portion of the graph 800 illustrates the control signal (e.g., vct illustrated in FIG. 8) that may be received by the charge pump module over time. For example, referring to FIG. 5, the middle portion of the graph 800 may illustrate the signal CONTROL_IN. As illustrated in FIG. 8, the control signal transitions from a logic low state (e.g., "0") to a logic high state (e.g., "1") at approximately 40 µs. Accordingly, the clock signal generated by the clock circuit increases in frequency at approximately 40 us before decreasing in frequency at approximately 58 µs. In addition, the control signal transitions from a logic high state (e.g., "1") to a logic low state (e.g., "0") at approximately 70 µs. Accordingly, the clock signal generated by the clock circuit increases in frequency at approximately 70 us before decreasing in frequency at approximately 86 µs.

The lower portion of the graph 800 illustrates the output voltage of the charge pump module over time. For example, referring to FIG. 5, the lower portion of the graph 800 may illustrate the voltage $V_{out}$. As illustrated in FIG. 8, the voltage $V_{out}$ general remains below −2.0V until approximately 70 us when the output voltage $V_{out}$ increase to approximately −0.8V. The output voltage $V_{out}$ decrease to below −2.0V over a time period of approximately 6 µs (e.g., at 76 µs).

Figure 9:
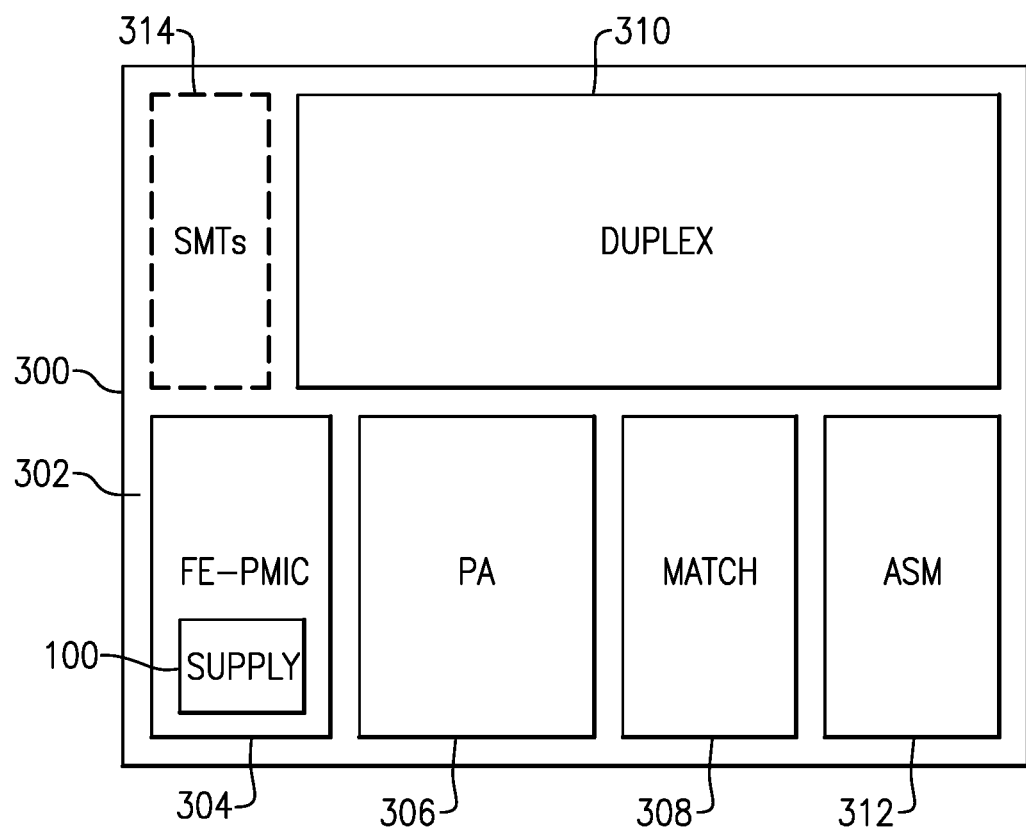
FIG. 9 is a schematic diagram of an example module according to some embodiments of the present disclosure.

FIG. 9 shows that in some embodiments, some or all of the voltage supply circuit having one or more features as described herein (e.g., having the charge pump module 500 illustrated in FIG. 5) can be implemented in a module. Such a module can be, for example, a front-end module (FEM). In the example of FIG. 9, a radio frequency (RF) module 300 can include a packaging substrate 302, and a number of components can be mounted on such a packaging substrate. For example, a front-end power management integrated circuit (FE-PMIC) component 304, a power amplifier assembly 306, a match component 308, and a duplexer assembly 310 can be mounted and/or implemented on and/or within the packaging substrate 302. Other components such as a number of surface mount technology (SMT) devices 314 and an antenna switch module (ASM) 312 can also be mounted on the packaging substrate 302. Although all of the various components are depicted as being laid out on the packaging substrate 302, it will be understood that some component(s) can be implemented over other component(s).

In some embodiments, a voltage supply circuit 100 having one or more features as described herein can be implemented as a part of the FE-PMIC component 304. For example, the voltage supply circuit 100 may include a charge pump module having one or more features as described herein.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 10:
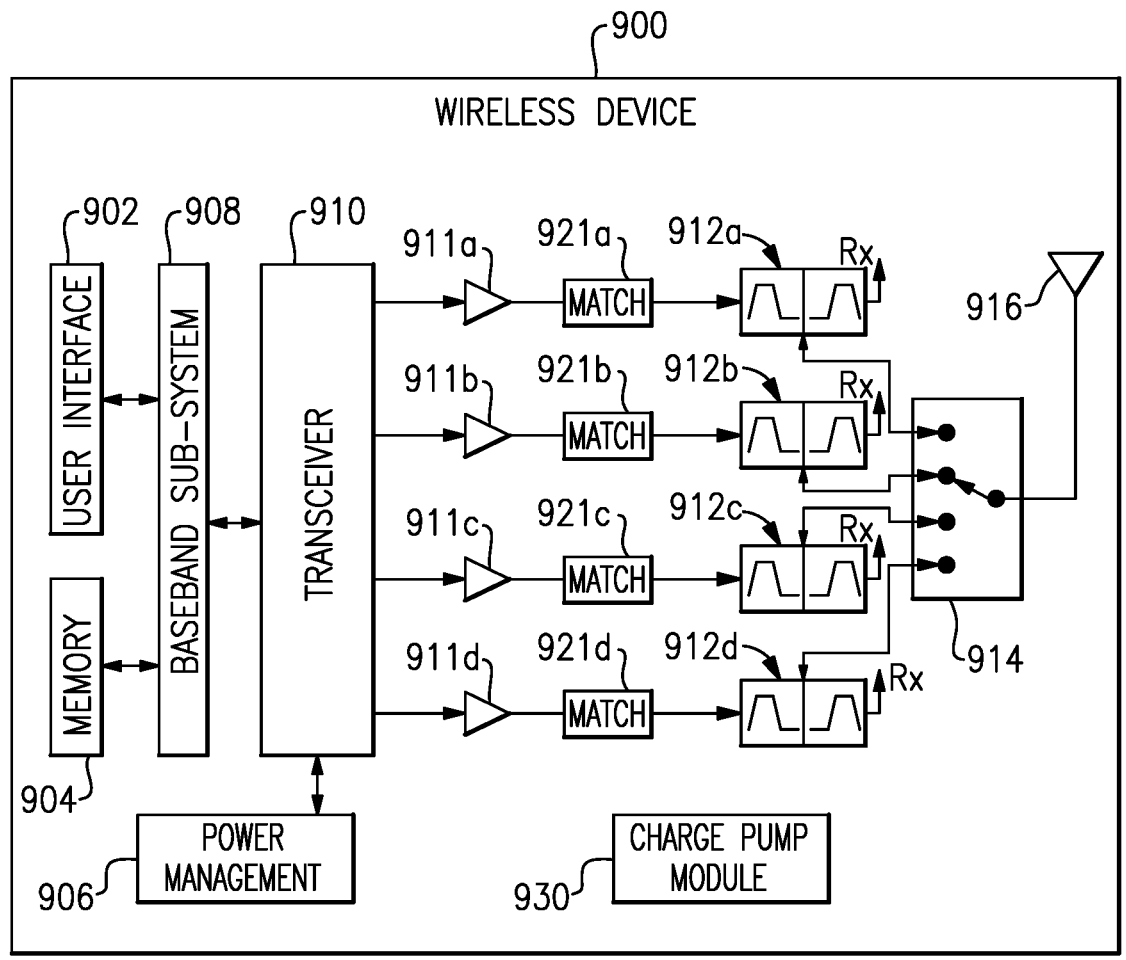
FIG. 10 is a schematic diagram of an example wireless device according to some embodiments of the present disclosure.

FIG. 10 depicts an example wireless device 900 having one or more advantageous features described herein. In the context of a module having one or more features as described herein, such a module can be generally depicted by a dashed box 300, and can be implemented as, for example, a front-end module (FEM). One or more PAs 911 are shown, which can facilitate, for example, multi-band operation of the wireless device 900. In some embodiments the PAs and their matching circuits may be packaged into a module.

Referring to FIG. 10, power amplifiers (PAS) 911 can receive their respective RF signals from a transceiver 910 that can be configured and operated in known manners to generate RF signals to be amplified and transmitted, and to process received signals. The transceiver 910 is shown to interact with a baseband sub-system 908 that is configured to provide conversion between data and/or voice signals suitable for a user and RF signals suitable for the transceiver 910. The transceiver 910 can also be in communication with a power management system 906 that is configured to manage power for the operation of the wireless device 900. Such power management can also control operations of the baseband sub-system 908 and the module 300.

The baseband sub-system 908 is shown to be connected to a user interface 902 to facilitate various input and output of voice and/or data provided to and received from the user. The baseband sub-system 908 can also be connected to a memory 904 that is configured to store data and/or instructions to facilitate the operation of the wireless device, and/or to provide storage of information for the user.

In the example wireless device 900, outputs of the PAs 911 are shown to be matched (via respective match circuits 921) and routed to their respective duplexers 912. Such amplified and filtered signals can be routed to an antenna 916 through an antenna switch 914 for transmission. The band-selection switch 914 can include, for example, a single-pole-multiple-throw (e.g., SP4T) switch to allow selection of an operating band (e.g., Band 2). In some embodiments, the duplexers 912 can allow transmit and receive operations to be performed simultaneously using a common antenna (e.g., 916). In FIG. 10, received signals are shown to be routed to "Rx" paths (not shown) that can include, for example, a low-noise amplifier (LNA).

In some embodiments, a voltage supply circuit/system such as described herein can be implemented as a part of the power management system 906. The example wireless device 900 also includes a charge pump module 930. The charge pump module 930 may have one or more features as described herein. The charge pump module 930 may be coupled to one or more of the power management system 906, the baseband sub-system 908, the transceiver, the PAs 911, the match circuits 921, and the duplexers 912.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS. The components described above in connection with FIG. 10 and wireless device 900 are provided as examples, and are non-limiting. Moreover, the various illustrated components may be combined into fewer components, or separated into additional components. For example, baseband sub-system 908 can be at least partially combined with the transceiver 910. As another example, the transceiver 910 can be split into separate receiver and transmitter portions.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A charge pump module comprising:
a clock circuit configured to generate a first clock signal in response to receiving a first control signal and a second clock signal in response to receiving a second control signal, the first clock signal having a different frequency from the second clock signal, the clock circuit coupled to an output of a comparator, the comparator including a first input provided with a voltage representative of a single input voltage of the charge pump module that is used to generate an output voltage of the charge pump module and a second input provided with a voltage of the single input voltage through a timing capacitance such that the clock circuit is provided with the first control signal when the voltage of the first input is less than the voltage of the second input and the clock circuit is provided with the second control signal when the voltage of the first input is equal to or greater than the voltage of the second input;
a driving circuit configured to generate a first set of clock signals based on the first clock signal and a second set of clock signals based on the second clock signal, the driving circuit coupled to the clock circuit; and
a charge pump core including a set of capacitances, the charge pump core configured to charge the set of capacitances based on the first set of clock signals and the second set of clock signals.

2. The charge pump module of claim 1 further comprising an oscillator configured to provide an initial clock signal to the clock circuit.

3. The charge pump module of claim 2 wherein the first clock signal and the second clock signal are based on the initial clock signal.

4. The charge pump module of claim 2 further comprising an inverter configured to generate an inverted initial clock signal based on the initial clock signal, the inverter coupled to the clock circuit and the driving circuit.

5. The charge pump module of claim 1 wherein the charge pump core includes a set of switches coupled to the set of capacitances.

6. The charge pump module of claim 5 wherein the charge pump core is further configured to open and close the set of switches at a first rate based on the first set of clock signals.

7. The charge pump module of claim 5 wherein the charge pump core is further configured to open and close the set of switches at a second rate based on the second set of clock signals.

8. The charge pump module of claim 1 wherein the clock circuit is coupled to the timing capacitance.

9. The charge pump module of claim 8 wherein the clock circuit is further configured to generate the second clock signal when the timing capacitance reaches a threshold voltage.

10. The charge pump module of claim 9 wherein the clock circuit is further configured to generate the first clock signal after generating the second clock signal for a period of time.

11. A method comprising:
generating a first clock signal in response to receiving a first control signal using a clock circuit coupled to an output of a comparator;
charging a set of capacitances of a charge pump module based on the first clock signal;
generating a second clock signal in response to receiving a second control signal using the clock circuit, the second clock signal having a different frequency from the first clock signal, the comparator including a first input provided with a voltage representative of a single input voltage of the charge pump module that is used to generate an output voltage of the charge pump module and a second input provided with a voltage of the single input voltage through a timing capacitance such that the clock circuit is provided with the first control signal when the voltage of the first input is less than the voltage of the second input and the clock circuit is provided with the second control signal when the voltage of the first input is equal to or greater than the voltage of the second input; and
charging the set of capacitances of the charge pump module based on the second clock signal.

12. The method of claim 11 wherein charging the set of capacitances based on the first clock signal includes generating a first set of clock signals based on the first clock signal.

13. The method of claim 12 wherein charging the set of capacitances based on the first clock signal further includes opening and closing a set of switches of the charge pump module at a first rate based on the first set of clock signals.

14. The method of claim 11 wherein charging the set of capacitances based on the second clock signal includes generating a second set of clock signals based on the second clock signal.

15. The method of claim 14 wherein charging the set of capacitances based on the second clock signal further includes opening and closing a set of switches of the charge pump module at a second rate based on the second set of clock signals.

16. The method of claim 11 further comprising generating the second clock signal when the timing capacitance reaches a threshold voltage.

17. The method of claim 11 further comprising generating the first clock signal after a period of time has elapsed since generating the second clock signal.

18. The method of claim 11 further comprising receiving an initial clock signal from an oscillator.

19. The method of claim 18 wherein the first clock signal and the second clock signal are based on the initial clock signal.

20. The method of claim 18 further comprising generating an inverted initial clock signal based on the initial clock signal using an inverter.

* * * * *